(12) United States Patent  
Yeh et al.

(10) Patent No.: US 8,860,044 B2
(45) Date of Patent: Oct. 14, 2014

(54) NITRIDE LIGHT-EMITTING DIODE WITH A CURRENT SPREADING LAYER

(75) Inventors: Meng-hsin Yeh, Xiamen (CN); Jyh-Chiamg Wu, Xiamen (CN); Shao-hua Huang, Xiamen (CN); Chi-lun Chou, Xiamen (CN); Hsing-wei Lu, Xiamen (CN); Kechuang Lin, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 210 days.

(21) Appl. No.: 13/551,636

(22) Filed: Jul. 18, 2012

(65) Prior Publication Data

US 2012/0280258 A1 Nov. 8, 2012

Related U.S. Application Data

(63) Continuation of application No. PCT/CN2011/083620, filed on Dec. 7, 2011.

(30) Foreign Application Priority Data

Dec. 31, 2010 (CN) .......................... 2010 1 0616969

(51) Int. Cl.
*H01L 33/02* (2010.01)
*H01L 33/32* (2010.01)
*H01L 33/14* (2010.01)
*H01L 33/00* (2010.01)

(52) U.S. Cl.
CPC ................ *H01L 33/14* (2013.01); *H01L 33/32* (2013.01); *H01L 33/007* (2013.01); *H01L 33/145* (2013.01); *H01L 33/025* (2013.01)
USPC ................................ 257/88; 257/101; 438/37

(58) Field of Classification Search
CPC ........ H01L 33/32; H01L 33/007; H01L 33/14
USPC ........................ 257/88, 101, E33.013; 438/37
See application file for complete search history.

(56) References Cited

U.S. PATENT DOCUMENTS

| 8,294,178 B2 * | 10/2012 | Koo et al. ..................... 257/101 |
| 2007/0045655 A1 * | 3/2007 | Song et al. ..................... 257/104 |
| 2010/0207100 A1 * | 8/2010 | Strassburg et al. ............. 257/15 |

* cited by examiner

*Primary Examiner* — Walter H Swanson
(74) *Attorney, Agent, or Firm* — Syncoda LLC; Feng Ma (57) ABSTRACT

A nitride light-emitting diode is provided including a current spreading layer. The current spreading layer includes a first layer having a plurality of distributed insulating portions configured to have electrical current flow therebetween; and a second layer including interlaced at least one substantially undoped nitride semiconductor layer and at least one n-type nitride semiconductor layer configured to spread laterally the electrical current from the first layer.

20 Claims, 7 Drawing Sheets

NITRIDE LIGHT-EMITTING DIODE WITH A CURRENT SPREADING LAYER

CROSS-REFERENCE TO RELATED APPLICATIONS

The present application is a continuation of PCT/CN2011/083620 filed on Dec. 7, 2011, which claims priority to Chinese Patent Application No. 201010616969.3 filed on Dec. 31, 2010. The disclosures of the above applications are hereby incorporated by reference in their entirety.

BACKGROUND

Developments in semiconductor lighting technologies, particularly with respect to the epitaxy and processing technologies of nitride semiconductor materials, have led to improved light emission efficiency of light-emitting diodes (LEDs).

SUMMARY

In an aspect, a nitride LED is provided including: a current spreading layer including: a first layer comprising a plurality of distributed insulating portions configured to have electrical current flow therebetween; and a second layer comprising interlaced at least one substantially undoped nitride semiconductor layer and at least one n-type nitride semiconductor layer configured to spread laterally the electrical current from the first layer.

In some implementations, the distributed insulating portions are separated by predetermined intervals.

In some implementations, the distributed insulating portions are formed by ion implantation.

In some implementations, the current spreading layer further includes a gradient-doped n-type nitride semiconductor layer disposed between the first and second layers and configured to repair defects in the first layer caused by the ion implantation.

In some implementations, the current spreading layer has a thickness of about 1000 Å~20000 Å.

In some implementations, the gradient-doped n-type nitride semiconductor layer has a thickness of about 200 Å~5000 Å.

In some implementations, the gradient-doped n-type nitride semiconductor layer is formed by secondary growth of epitaxy, and has a silicon doping concentration that gradually changes from about $1\times10^{17}$ cm$^{-3}$ to about $5\times10^{19}$ cm$^{-3}$.

In some implementations, the gradient-doped n-type nitride semiconductor layer is formed by secondary growth of epitaxy, and has a silicon doping concentration that gradually changes from about $5\times10^{18}$ cm$^{-3}$ to about $1\times10^{18}$ cm$^{-3}$.

In some implementations, the second layer has a thickness of about 700 Å~10,000 Å, the substantially undoped nitride semiconductor layer and the n-type nitride semiconductor layer have a thickness ratio of >0.8, and a period of the interlacing layers is 1-20.

In some implementations, the second layer has a thickness of about 1800 Å~3600 Å, the thickness ratio is 5:1, and the period is 3.

In some implementations, the at least one substantially undoped nitride semiconductor layer has a silicon doping concentration of less than about $5\times10^{17}$ cm$^{-3}$, the at least one n-type nitride semiconductor layer has a silicon doping concentration greater than about $1\times10^{18}$ cm$^{-3}$.

In some implementations, the first layer has a thickness of about 100 Å~5000 Å.

In some implementations, the LED further includes: a sapphire substrate; an n-side layer; a p-side layer; and a nitride semiconductor light-emitting layer disposed between the n-side layer and the p-side layer; wherein the n-side layer comprises: a buffer layer; and an n-layer, wherein the current spreading layer is formed in the n-layer, and wherein the current spreading layer is coupled to the light-emitting layer.

In another aspect, a method of making an LED is provided, the method including: forming a current spreading layer by: forming a first layer including a plurality of distributed insulating portions to allow electrical current to flow therebetween; and interlacing at least one substantially undoped nitride semiconductor layer and at least one n-type nitride semiconductor layer to form a second layer, wherein the second layer is configured to spread laterally the electrical current received from the first layer.

In some implementations, said forming a first layer comprises forming the distributed insulating portions in an n-layer by ion implantation.

In some implementations, the method further includes forming a gradient-doped n-type nitride semiconductor layer between the first and second layers and to repair defects in the first layer caused by the ion implantation.

In another aspect, a light-emitting system including a plurality of nitride LEDs is provided, each LED including: a current spreading layer including: a first layer comprising a plurality of distributed insulating portions configured to have electrical current flow therebetween; and a second layer comprising interlaced at least one substantially undoped nitride semiconductor layer and at least one n-type nitride semiconductor layer configured to spread laterally the electrical current from the first layer.

In some implementations, the distributed insulating portions are separated by predetermined intervals.

In some implementations, the distributed insulating portions are formed by ion implantation.

In some implementations, the current spreading layer further includes a gradient-doped n-type nitride semiconductor layer disposed between the first and second layers and configured to repair defects in the first layer caused by the ion implantation and to guide electrical current received from the first layer.

DETAILED DESCRIPTION

Figure 1:
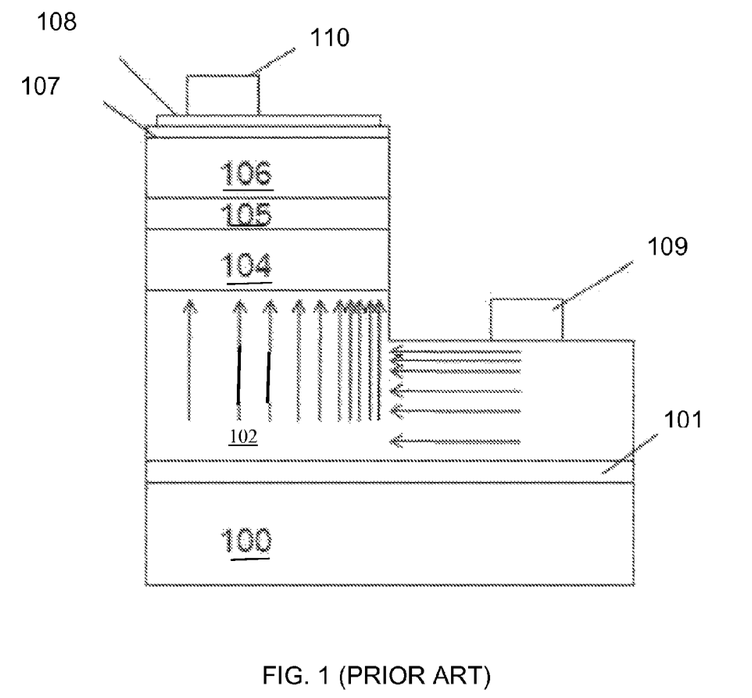
FIG. 1 illustrates a structure of a conventional nitride LED and example current paths therein.

FIG. 1 illustrates the structure of a conventional nitride LED and example current path therein. In this structure, over the sapphire substrate 100, a plurality of layers are epitaxially grown. These layers include a buffer layer 101, an n-type nitride semiconductor layer 102, a light-emitting layer 104, a p-type cladding layer 105, a p-type nitride semiconductor layer 106, a p-type contact layer 107 formed over the p-type nitride semiconductor layer 106, a p-electrode 108 formed over the p-type contact layer 107, and an n-electrode 109 formed over the n-type nitride semiconductor layer 102.

Because the electrical current tends to flow in a shorter path between the n electrode 109 and the p electrode 108, the current density may become overly high in some portions of the LED. This may cause current crowding, and thus limit the light output efficiency.

According to some of the disclosed implementations, a compound dual current spreading layer may be provided in a nitride LED to substantially improve the light output efficiency of the LED.

In an example, the LED with the compound dual current spreading layer may include: a sapphire substrate; an n-side layer and a p-side layer formed with nitride semiconductor; and a light-emitting layer between the n-side layer and the p-side layer.

The n-side layer may include a plurality of layers, including a buffer layer, an n-type nitride semiconductor layer, and the compound dual current spreading layer. The compound dual current spreading layer may include a first current spreading layer and a second current spreading layer. The first current spreading layer may be a distribution insulating layer formed in the n-type nitride semiconductor layer. The second current spreading layer may be formed by an interlacing u-type nitride semiconductor layer and an n-type nitride semiconductor layer. The compound dual current spreading layer may connect respectively to the n-type nitride semiconductor layer and the active layer.

In some implementations, the distribution insulating layer may include insulating portions separated by predetermined intervals.

In some implementations, the distribution insulating layer may be formed by ion implantation.

In some implementations, a gradient-type silicon doped n-type nitride semiconductor layer may be further included between the first current spreading layer and the second current spreading layer.

In some implementations, the compound dual current spreading layer has a thickness of about 1000 Å~20000 Å.

In some implementations, the first current spreading layer has a thickness of about 100 Å~5000 Å.

In some implementations, the gradient-type silicon doped n-type nitride semiconductor layer has a thickness of about 200 Å~5000 Å.

In some implementations, the gradient-type silicon doped n-type nitride semiconductor layer is formed by secondary growth of epitaxy, wherein the silicon doping concentration gradually changes from about $1\times10^{17}$ cm$^{-3}$ to about $5\times10^{19}$ cm$^{-3}$.

In some implementations, the gradient-type silicon doped n-type nitride semiconductor layer is formed by secondary growth of epitaxy, wherein the silicon doping concentration gradually changes from about $5\times10^{18}$ cm$^{-3}$ to about $1\times10^{18}$ cm$^{-3}$.

In some implementations, the second current spreading layer has a thickness of about 700 Å~10,000 Å, the u-type nitride semiconductor layer and the n-type nitride semiconductor layer has a thickness ratio of >0.8, and the period of the stacked layers is about 1-20.

In some implementations, the second current spreading layer has a thickness of about 1800 Å~3600 Å, the u-type nitride semiconductor layer and the n-type nitride semiconductor layer has a thickness ratio of about 5:1, and the period of stacked layers is about 3.

In some implementations, in the second current spreading layer, the silicon doping concentration in the u-type nitride semiconductor layer is less than about $5\times10^{17}$ cm$^{-3}$, the silicon doping concentration in the n-type nitride semiconductor layer is greater than about $1\times10^{18}$ cm$^{-3}$.

The "u-type nitride semiconductor" may generally refer to a low-doped nitride semiconductor. For example, the doping concentration may be less than $5\times10^{17}$ cm$^{-3}$.

Figure 3:
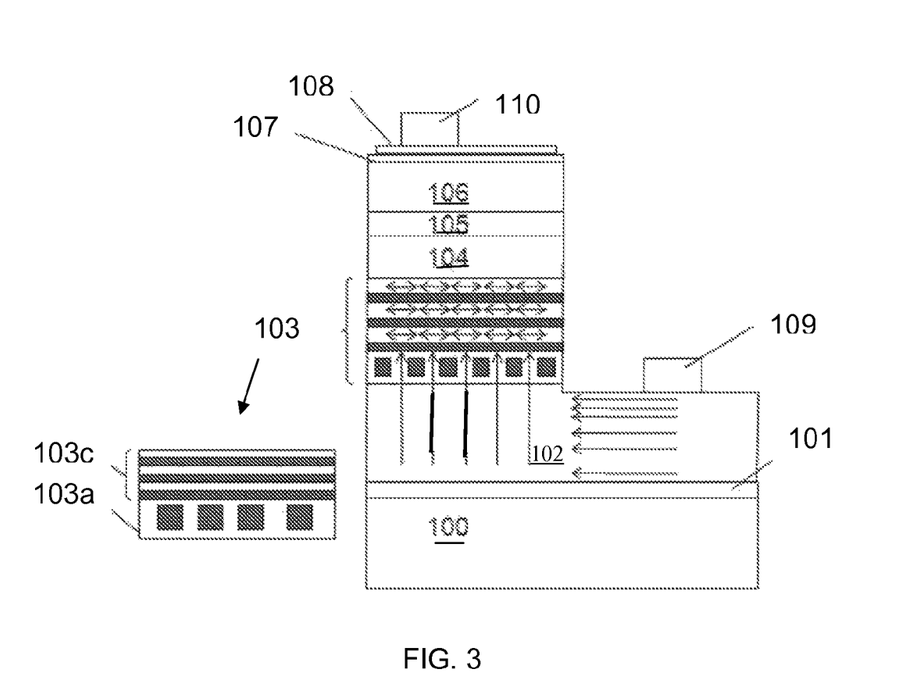
FIG. 3 is a schematic illustration of a current spreading in the nitride LED according to some of the disclosed implementations.
Figure 5:
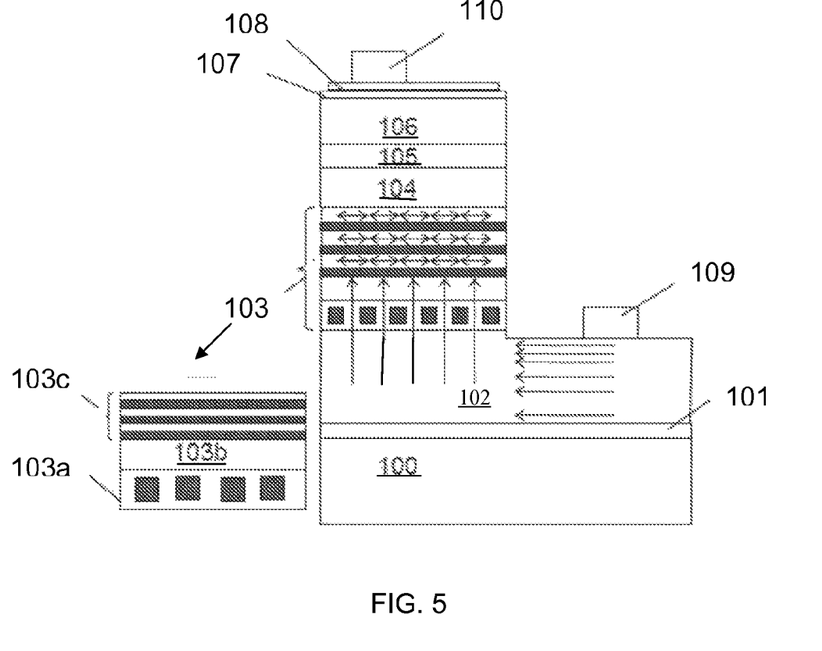
FIG. 5 is a schematic illustration of a current spreading in the nitride LED of FIG. 4.

In some embodiments, the first current spreading layer in the compound dual current spreading layer forms an insulation layer in the n-type nitride semiconductor layer, and can force a uniform current distribution, forming a uniformly distributed point-like current source (see, e.g., FIG. 3 and FIG. 5). The second current spreading layer may be formed by interlacing u-type nitride semiconductor layer and n-type nitride semiconductor layers. The second current spreading layer may, for the uniformly distributed point-like electrical current sources formed by the first current spreading layer, through the interlaced u-type layer and n-type layer, force a horizontal expansion of the point-like current sources. As such, the current may extend to the entire light-emitting area with improved uniformity, and current crowding may be reduced.

In some implementations, a gradient-doped n-type layer is added between the first current spreading layer and the second current spreading layer. This gradient-doped n-type layer may, through its gradient in the silicon doping concentration, repair the surface defects caused by the first current spreading layer, particularly the formation of the distributed insulating portions. As such, the quality of the nitride semiconductor layer lattice after the secondary epitaxy may be improved. In addition, the gradient-doped n-type layer may serve as a current guide layer for the second current spreading layer.

Advantages of the disclosed implementations may include, for example, that the current spreading layer can distribute the current to the entire light-emitting area substantially uniformly, reduce current crowding, and thus can effectively improve the LED's light output efficiency. In addition, the static breakdown voltage may be increased.

Figure 2:
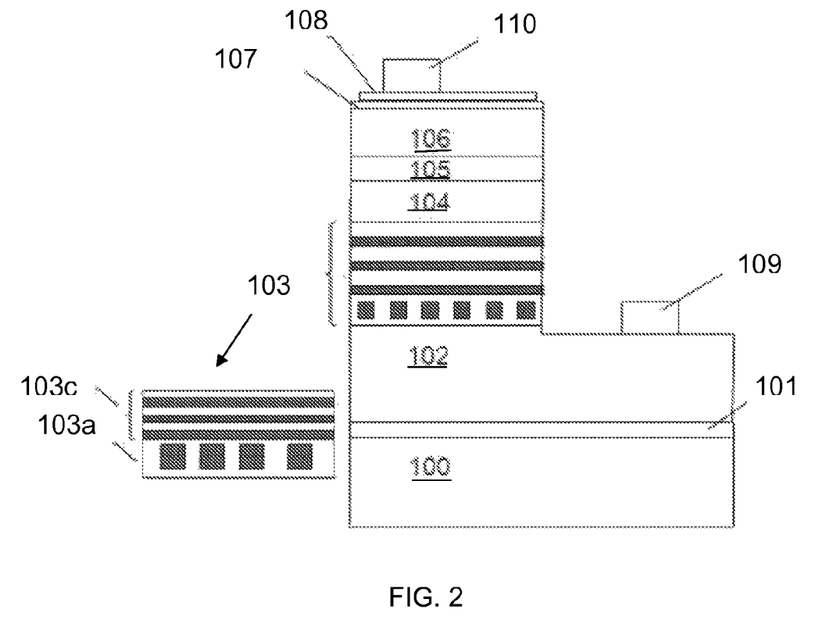
FIG. 2 illustrates a profile of a nitride LED according to some of the disclosed implementations.

FIG. 2 illustrates an LED structure according to some implementations. The structure may include a plurality of layers stacked over the sapphire substrate 100. For example, a buffer layer 101 may be included, which may comprise GaN, AlN, or GaAlN, and have a thickness of about 200 Å~500 Å.

An n-type nitride semiconductor layer 102 may be included, which may comprise Si-doped GaN, and have a thickness of about 20,000 Å to 40,000 Å.

A compound dual current spreading layer 103 may include a first current spreading layer and a second current spreading layer, and have a thickness of about 1000 Å~20,000 Å. The first current spreading layer 103a may be a distributed insulating layer formed by ion implantation in the n-type nitride semiconductor layer 102. The distributed insulating layer may comprise insulation portions, which may be different in sizes, or substantially in size. These portions may be separated by predetermined intervals, which may be periodic in the lateral direction, or may be uneven or non-uniform intervals.

The second current spreading layer 103c may be formed by interlacing undoped u-type nitride semiconductor layers and n-type nitride semiconductor layers. The u-type nitride semiconductor layer may have a silicon doping concentration of, for example, about $5\times10^{16}$ cm$^{-3}$. The n-type nitride semiconductor layer may have a silicon doping concentration of for example, about $1 \times 10^{19}$ cm³. The u-type nitride semiconductor layer and the n-type nitride semiconductor layer may have a thickness ratio of for example, about 5:1. The period of the stacked u-type/n-type layers may be, for example, 3.

A multi-quantum well structure light-emitting layer 104 may have an InGaN layer as a well layer, and a GaN layer as a barrier layer. The well layer may have a thickness of about 18 Å~30 Å, for example, and the barrier layer may have a thickness of 80 Å~200 Å, for example.

A p-type cladding layer 105 may comprise AlInGaN doped with Mg, and have a thickness of about 100 Å~600 Å, for example.

The p-type layer 106 and the p-type contact layer 107 may be formed by GaN, InGaN, or another GaN-based material. The thickness of the p-type layer 106 may be about 1000 Å~3000 Å, for example, and the thickness of the p-type contact layer 107 may be about 50 Å to 200 Å, for example.

The p-side and n-side electrodes may be formed as illustrated in FIG. 2. In a corner of the LED, a portion from the p-type contact layer 107 to the n-type nitride semiconductor layer 102 may be removed by etching. The n-type nitride semiconductor layer 102 may be exposed, and n Ohmic electrode 109 may be formed on the exposed n-type nitride semiconductor layer 102. In addition, the p Ohmic electrode 108 may be formed over almost the entire surface of the p-type contact layer 107, and the pad 110 may be formed over a portion of the p Ohmic electrode 108.

In the example illustrated in FIG. 2, the first current spreading layer 103a may form a distributed insulating layer in the n-type nitride semiconductor layer through ion implantation. As such, the electrical current may be forced to be more evenly distributed. This may be viewed as forming a plurality of laterally distributed point-like current sources (see, e.g., FIG. 3).

The second current spreading layer 103c in the current spreading layer 103 may be formed by interlacing a plurality of u-type nitride semiconductor layers and n-type nitride semiconductor layers. Through the interlaced u-type layers and n-type layers, the point-like current sources formed by the first current spreading layer may be further forced to have a two-dimensional lateral expansion. Therefore, the current can be more evenly distributed to substantially the entire light-emitting area.

Variations in the design parameters may be implemented to achieve improved results. For example, the shapes, sizes, and distribution densities of the insulation portions (e.g., islands) of the first current spreading layer may be varied, and the insulation portions may have non-even distributions in sizes, locations, distributions, shapes, etc., or may be substantially uniform.

In the second current spreading layer, the thickness ratio of the u-type layer and the n-type layers, the number of layer cycles (e.g., the period), the doping concentrations, etc. may also be varied, and may be varied according to the parameters of the first current spreading layer. For example, if the distribution density of insulation portions in the first current spreading layer is high, then the number of stacked layer cycle needed for the second current spreading layer may be smaller. Conversely, if the distribution density of the first current spreading layer insulation layer is low, then the number of stacked layer cycles needed for the second current spreading layer may be larger.

This can help the current to be more evenly distributed to almost the entire light-emitting area, and thus can effectively improve the light output efficiency of the LED, and increase its electrostatic breakdown voltage. For example, an improved LED may be 10%~20% more luminous than a conventional LED. This may be attributed to the current spreading, as illustrated in FIG. 3, wherein illustrative current paths may be compared with those of FIG. 1 (without a current spreading layer).

Figure 4:
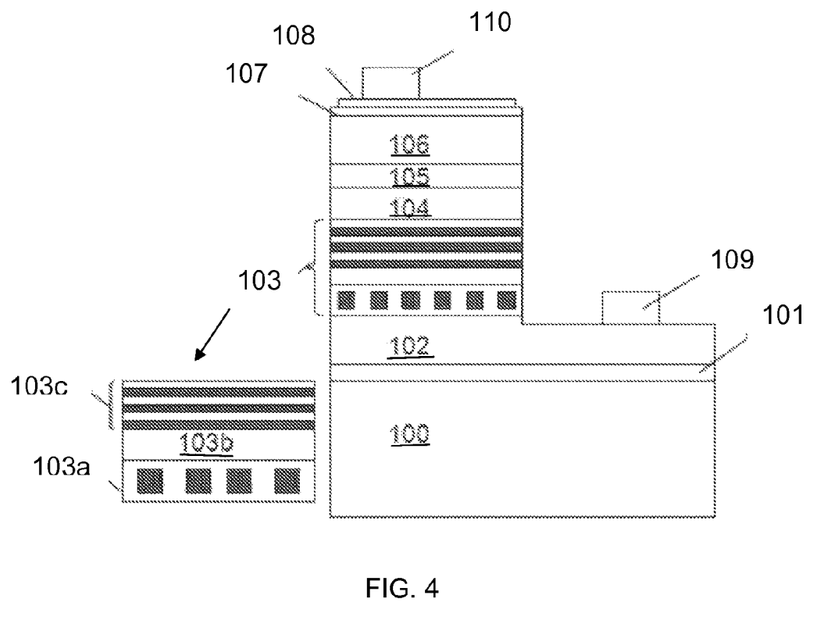
FIG. 4 illustrates a profile of a nitride LED according to some other implementations.

FIG. 4 shows a cross-sectional view of the structure of the nitride LED according to some other implementations. As compared with the structure illustrated in FIG. 2, the current spreading layer has an additional gradient-doped n-type layer 103b between the first current spreading layer 103a and the second current spreading layer 103c. The gradient-doped n-type layer 103b may have a thickness of about 200 Å~5000 Å. This layer may comprise an n-type nitride semiconductor layer, in which the silicon doping concentration gradually changes from a low doping level (e.g., about $1 \times 10^{17}$ cm⁻³) to a high doping level (e.g., about $1 \times 10^{19}$ cm⁻³). This layer may be formed by a secondary epitaxy process.

Through the gradient doping, the surface defects caused by ion implantation in the first current spreading layer may be repaired. Therefore, the quality of the nitride semiconductor layer lattice may be substantially maintained or improved even after the secondary epitaxy process. In addition, gradient-doped n-type layer 103b can also serve as a current guide layer for the second current spreading layer.

In some experiments, two types of samples are fabricated based on the disclosed embodiments and the conventional techniques, respectively (i.e. with or without the current spreading layer), to evaluate their light output power and electrostatic breakdown voltage characteristics.

Figure 6:
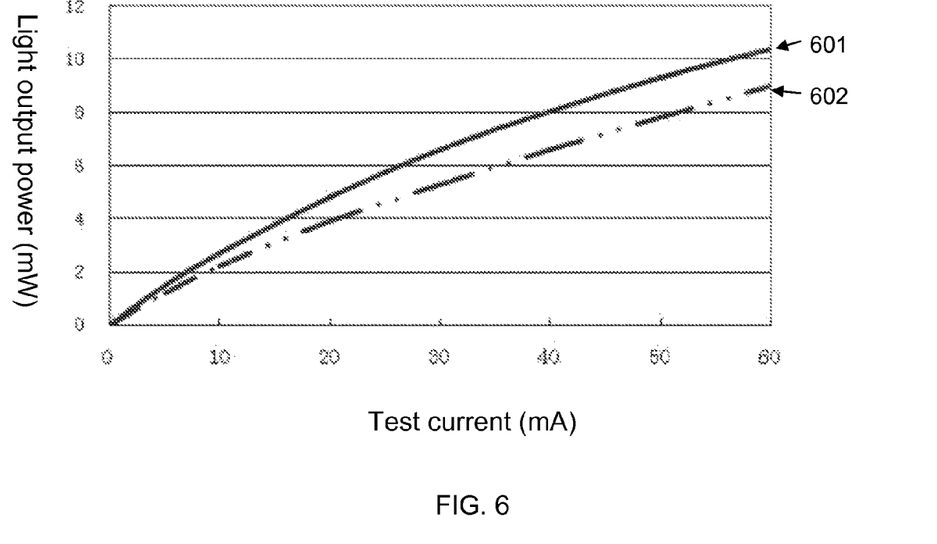
FIG. 6 illustrates light output power of an example LED according to some of the disclosed implementations as compared with a conventional LED.
Figure 7:
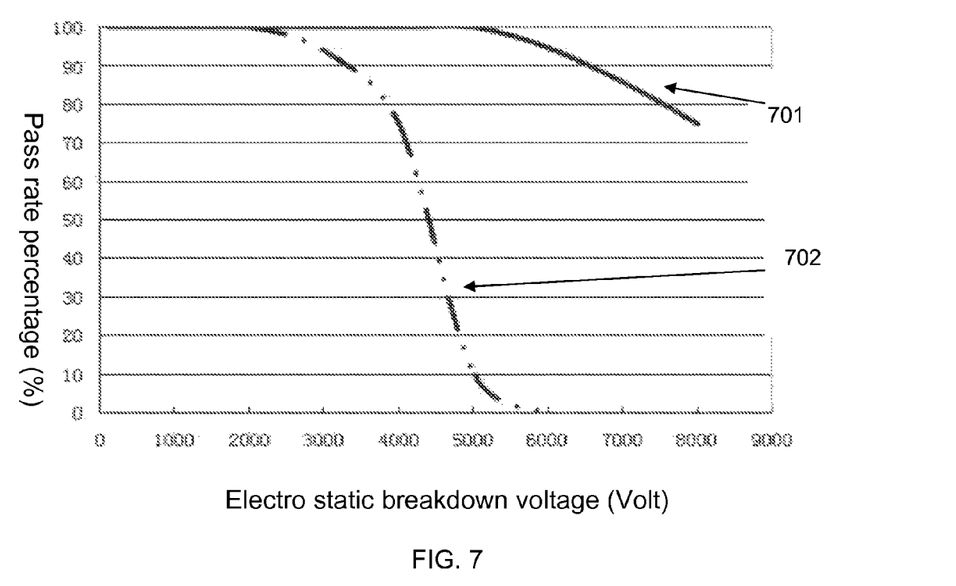
FIG. 7 illustrates a pass rate vs. static breakdown voltage of an LED according to some of the disclosed implementations as compared with a conventional LED.

Some parameters of the two samples are listed in Table 1, and some measurement results are illustrated in FIGS. 6 and 7.

TABLE 1

| Semiconductor layer | Thickness (Å) and structure of the various layers in the LED according to the disclosed embodiments | Thickness (Å) and structure of the various layers of a conventional LED |
| --- | --- | --- |
| Buffer layer 101 | 300 | 300 |
| n-type 102 | 25000 | 25000 |
| Compound dual current spreading layer 103 | Thickness of 103a: 1500; Thickness of 103b: 1500; Thickness of 103c: 3500; (total thickness of layer 103: 6500) | None |
| Light-emitting layer 104 | GaN(140)/InGaN(25) × 10 periods (the last one being the GaN layer) | GaN(140)/InGaN(25) × 10 periods (the last one being the GaN layer) |
| p-type limiting layer 105 | 600 | 600 |
| p-type layer 106 | 2000 | 2000 |
| p-type contact layer 10 | 100 | 100 |

As shown in FIG. 6, the light output power 601 of the LED according to the disclosed embodiments is about 20% higher than the light output power 602 of the conventional LED of comparison.

As shown in FIG. 7, in the form of a pass rate vs. the static breakdown voltage, the LEDs according to the disclosed embodiments can have a higher electrostatic breakdown voltage than that of the conventional LEDs of comparison, as illustrated in the curve 701 for the LEDs according to the disclosed embodiments as compared with the curve 702 for conventional LEDs.

Although specific embodiments have been described above in detail, the description is merely for purposes of illustration. It should be appreciated, therefore, that many aspects described above are not intended as required or essential elements unless explicitly stated otherwise. Various modifications of and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride light-emitting diode (LED) comprising:
a current spreading layer including:
a first layer comprising a plurality of distributed insulating portions configured to have electrical current flow therebetween; and
a second layer comprising interlaced at least one substantially undoped nitride semiconductor layer and at least one n-type nitride semiconductor layer configured to spread laterally the electrical current from the first layer.

2. The LED of claim 1, wherein the distributed insulating portions are separated by predetermined intervals.

3. The LED of claim 2, wherein the distributed insulating portions are formed by ion implantation.

4. The LED of claim 3, wherein the current spreading layer further includes a gradient-doped n-type nitride semiconductor layer disposed between the first and second layers and configured to repair defects in the first layer caused by the ion implantation.

5. The LED of claim 4, wherein the current spreading layer has a thickness of about 1000 Å~20000 Å.

6. The LED of claim 4, wherein the gradient-doped n-type nitride semiconductor layer has a thickness of about 200 Å~5000 Å.

7. The LED of claim 4, wherein the gradient-doped n-type nitride semiconductor layer is formed by secondary growth of epitaxy, and has a silicon doping concentration that gradually changes from about $1\times10^{17}$ cm$^{-3}$ to about $5\times10^{19}$ cm$^{-3}$.

8. The LED of claim 4, wherein the gradient-doped n-type nitride semiconductor layer is formed by secondary growth of epitaxy, and has a silicon doping concentration that gradually changes from about $5\times10^{18}$ cm$^{-3}$ to about $1\times10^{18}$ cm$^{-3}$.

9. The LED of claim 4, wherein the second layer has a thickness of about 700 Å~10,000 Å, the substantially undoped nitride semiconductor layer and the n-type nitride semiconductor layer have a thickness ratio of >0.8, and a period of the interlacing layers is 1-20.

10. The LED of claim 9, wherein the second layer has a thickness of about 1800 Å~3600 Å, the thickness ratio is 5:1, and the period is 3.

11. The LED of claim 1, wherein the at least one substantially undoped nitride semiconductor layer has a silicon doping concentration of less than about $5\times10^{17}$ cm$^{-3}$, the at least one n-type nitride semiconductor layer has a silicon doping concentration greater than about $1\times10^{18}$ cm$^{-3}$.

12. The LED of claim 1, wherein the first layer has a thickness of about 100 Å~5000 Å.

13. The LED of claim 1, further comprising:
a sapphire substrate;
an n-side layer;
a p-side layer; and
a nitride semiconductor light-emitting layer disposed between the n-side layer and the p-side layer;
wherein the n-side layer comprises:
a buffer layer; and
an n-layer,
wherein the current spreading layer is formed in the n-layer, and
wherein the current spreading layer is coupled to the light-emitting layer.

14. A method of making a nitride light-emitting diode (LED), the method comprising:
forming a current spreading layer by:
forming a first layer comprising a plurality of distributed insulating portions to allow electrical current to flow therebetween; and
interlacing at least one substantially undoped nitride semiconductor layer and at least one n-type nitride semiconductor layer to form a second layer,
wherein the second layer is configured to spread laterally the electrical current received from the first layer.

15. The method of claim 14, wherein said forming a first layer comprises forming the distributed insulating portions in an n-layer by ion implantation.

16. The method of claim 15, further comprising forming a gradient-doped n-type nitride semiconductor layer between the first and second layers and to repair defects in the first layer caused by the ion implantation.

17. A light-emitting system comprising a plurality of nitride light-emitting diodes (LEDs), each LED comprising:
a current spreading layer including:
a first layer comprising a plurality of distributed insulating portions configured to have electrical current flow therebetween; and
a second layer comprising interlaced at least one substantially undoped nitride semiconductor layer and at least one n-type nitride semiconductor layer configured to spread laterally the electrical current from the first layer.

18. The light-emitting system of claim 17, wherein the distributed insulating portions are separated by predetermined intervals.

19. The light-emitting system of claim 18, wherein the distributed insulating portions are formed by ion implantation.

20. The light-emitting system of claim 19, wherein the current spreading layer further includes a gradient-doped n-type nitride semiconductor layer disposed between the first and second layers and configured to repair defects in the first layer caused by the ion implantation and to guide electrical current received from the first layer.

* * * * *